Figure 1:
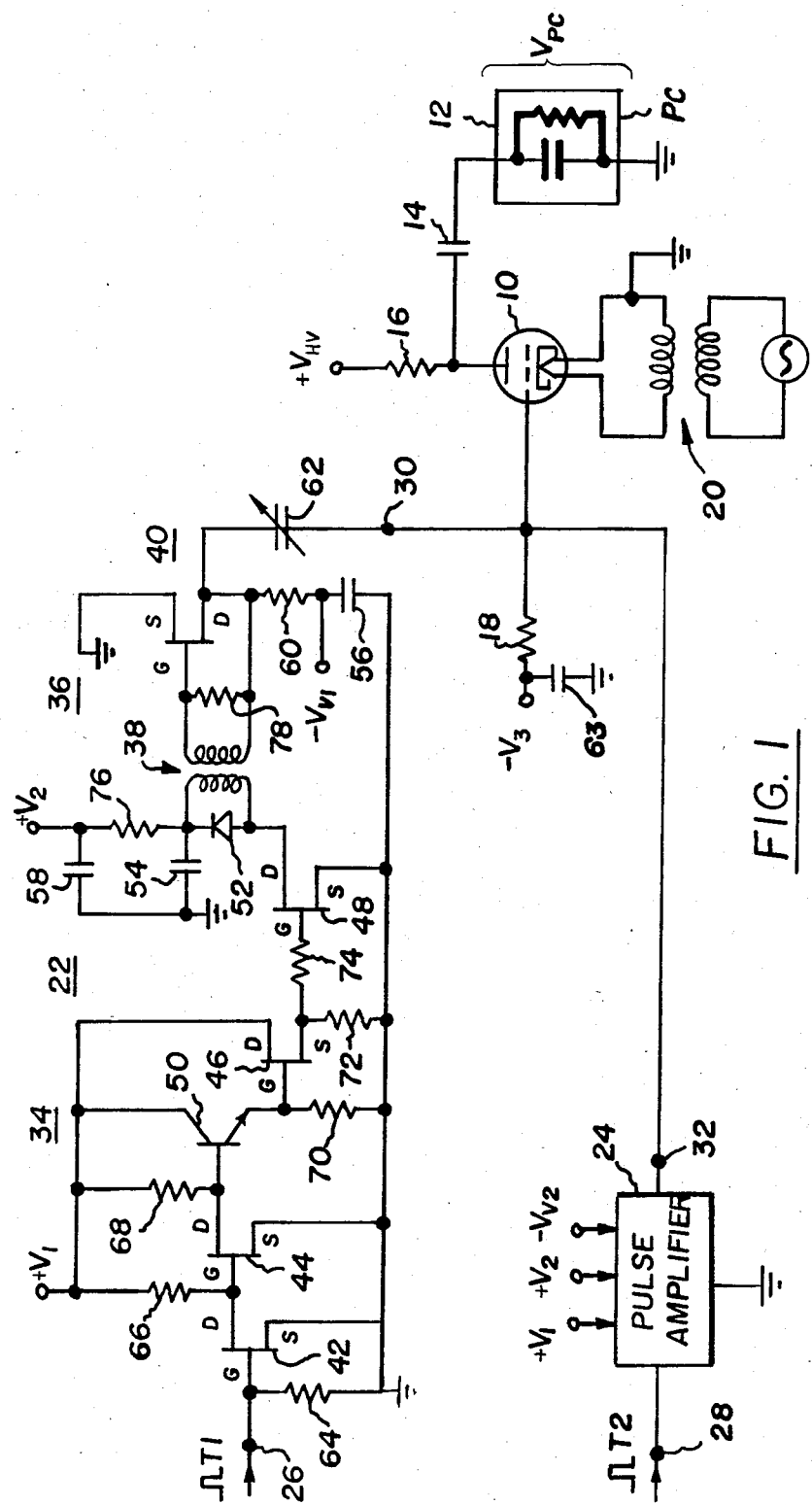

United States Patent [19]

Bouvier et al.

[11] Patent Number: 4,629,993
[45] Date of Patent: Dec. 16, 1986

[54] POCKELS CELL DRIVER

[75] Inventors: Marcel A. Bouvier, Aix En Provence, France; Philippe Bado, Rochester, N.Y.

[73] Assignee: The University of Rochester, Rochester, N.Y.

[21] Appl. No.: 723,394

[22] Filed: Apr. 15, 1985

[51] Int. Cl.$^4$ .......................... H03K 4/02; H03K 4/08; H03K 17/56
[52] U.S. Cl. ........................ 328/67; 328/186; 307/246; 307/227; 307/270; 350/393
[58] Field of Search .................. 350/352, 393, 356; 307/246, 316, 228, 270, 227; 328/67, 186

[56] References Cited

U.S. PATENT DOCUMENTS

| | | | |
|---|---|---|---|
| 2,597,013 | 5/1952 | Marchetti | 328/67 |
| 3,487,214 | 12/1969 | Vossberg | 328/186 |
| 4,097,844 | 6/1978 | Moyer | 307/227 |
| 4,446,436 | 5/1984 | Ireland | 328/186 |

OTHER PUBLICATIONS

J. Phys E: Sci. Instrum, "La ser Pulse Selection with Krytron Triggered Kerr Shutter", A. Penzkofer et al., vol. 14, No. 12, Dec. 1981.
Generation of White Light at 1 kHz, SPIE 533, Ultra Short Pulse Spectroscopy and Applications, Bado et al., 1985.
Conference on Lasers and Electro-optics Post Deadline papers PD3-1, Duling et al., Jun. 1984, 3 pages.
Univ. of Rochester Laboratory for Laser Energetics Annual Report 10/83-9/84, pp. 135 and 136.
"Kilo Hertz Synchronous Amplification of 85-fs Optical Pulses", Duling et al., J. Opt. Soc. B., Apr. 1985.

Primary Examiner—Stanley D. Miller
Assistant Examiner—B. P. Davis
Attorney, Agent, or Firm—Martin LuKacher

[57] ABSTRACT

A Pockels cell driver using a microwave triode which transfers charge from a high voltage source to a Pockels cell via a storage capacitor. The microwave tube is controlled, through its grid voltage, by two pulse amplifiers each having a plurality of tandem field effect transistor (FET) stages so as to increase the voltage across the cell in two steps having a selected delay therebetween. The driver is especially useful for seeding and extracting output pulses from a regenerative laser amplifier having the Pockels cell within its cavity. The driver may be used to operate a Pockels cell as a switch-out or shutter to select a single pulse from a pulse laser such as a mode-locked Q-switched laser.

10 Claims, 2 Drawing Figures

POCKELS CELL DRIVER

DESCRIPTION

The present invention relates to electro-optical apparatus, and particularly to a driver circuit for a Pockels cell which may be used to control the transmission of laser pulses.

The invention is especially suitable for use in a regenerative laser amplifier wherein the Pockels cell is contained in the laser amplifier cavity for seeding (controlling the injection) of laser pulses into the cavity and for the extraction of the amplified pulses from the cavity. In order to provide for both injection and extraction with a single Pockels cell, it is desirable to provide both quarter-wave and half-wave retardation with the Pockels cell. The interval between the times when quarter-wave and half-wave retardation occur determines the amplification of the injected pulses and must be carefully controlled. In addition, the temporal separation of the incident pulses which are to be injected into the laser cavity for amplification, is very short, typically ten to twelve nanoseconds, therefore requiring a fast rise time which is less than the temporal separation in order to inject a single pulse into the cavity.

The Pockels cell driver provided by this invention is capable of increasing the voltage across a Pockels cell in steps to provide both quarter-wave and half-wave retardation separated by the requisite interval so as to facilitate the amplification of pulses in such a regenerative laser amplifier over a wide range of repetition rates, for example up to 20 kHz. The invention is not limited to providing two steps of retardation, but also may control the retardation in a multiplicity of steps with selected temporal separation between the steps. The invention is also generally applicable to electro-optical devices useful as optical shutters to select one or more laser pulses out of a train of laser pulses, for example with a Pockels cell placed between crossed polarizers through which the optical pulse train passes, as well as in other applications wherever electro-optically induced phase retardation may be needed.

The regenerative laser amplifier discussed above and a Pockels cell driver over which the present invention is an improvement is described in U.S. patent application Ser. No. 618,274 filed June 7, 1984 in the name of S. L. Williamson, G. Mourou, I. N. Duling, P. Bado and C. H. Petras and assigned to the same assignee as the present application. This regenerative amplifier, and the Pockels cell driver is also described in I. N. Duling, P. Bado, S. Williamson, and G. Mourou, A Stable Kilohertz Nd:YAG Regenerative Amplifier, CLEO '84, Conference on Lasers and Electro-Optics, Post Deadline Papers, PD3-1 (June 19-22, 1984). Another Pockels cell driver over which the present invention is an improvement is described in U.S. patent application Ser. No. 581,144 filed Feb. 17, 1984 in the name of T. Sizer, I. N. Duling, C. H. Petras and S. A. Letzring and assigned to the same assignee as the present application. A Pockels cell driver as described in the aforementioned U.S. patent application Ser. No. 581,144 is also described in the University of Rochester Laboratory for Laser Energetics Annual Report, Oct. 1, 1983–Sept. 30, 1984, pages 135 and 136.

As discussed in U.S. patent application Ser. No. 581,144, conventional Pockels cell drivers have included spark gaps, gas tubes, or avalanche transistors, which switch voltage to a charge-line for generating the voltage across a Pockels cell (see U.S. Pat. Nos. 3,577,097, 3,849,732 and 3,910,679). The Pockels cell drivers described in the aforementioned U.S. patent applications Ser. Nos. 581,144 and 618,274 and in the above mentioned papers by Sizer, et al. and Duling, et al. utilize a microwave tube which transfers charge from a high voltage source to a Pockels cell via a storage capacitor to obtain the voltage across the cell which controls the optical retardation thereof. The microwave triode has its grid driven by an avalanche transistor circuit in order to control the voltage applied to the Pockels cell. It is desirable to increase the repetition rate at which the voltage across the Pockels cell can be changed and to reliably change the voltage in a multiplicity of steps. It has been found that the avalanche transistor based driver limits the repetition rate and is difficult to control in obtaining multiple voltage steps across the Pockels cell.

The present invention provides an improved driver circuit which overcomes the limitations imposed by the use of avalanche transistors to control the grid voltage of the microwave tube. The improved drivers circuit provided by the invention also has the following features: high reliability; high repetition rate, for example, up to 20 kHz, thereby enabling regenerative laser amplifiers to provide amplified laser pulses at higher repetition rates, for example up to 20 kHz; and reliably applying multiple voltage steps to a single Pockels cell with selected temporal delays between the steps and enabling a regenerative amplifier to operate with a single Pockels cell instead of two Pockels cells thereby decreasing the intra-cavity losses in the amplifier and increasing the average power and energy per pulse of the output pulses produced by the regenerative laser amplifier.

Briefly described the present invention may be used in a Pockels cell driver circuit wherein a Pockels cell is charged via a vacuum tube to increase the voltage across the cell in a plurality of steps having a selected delay between each of the steps. The driver circuit utilizes a plurality of pulse amplifiers, each preferably including a plurality of field effect transistor (FET) stages acting as current amplifiers which decrease the rise time of the pulses outputted therefrom. Each of the amplifiers has an input for a separate one of a plurality of trigger pulses with the selected delays therebetween. Each of the amplifiers has an output connected to the grid of the microwave tube for applying an amplified pulse corresponding to the trigger pulse, which is applied thereto, to the grid of the tube to enable the cell to charge to each of the voltage steps with the selected delays therebetween.

Figure 2:
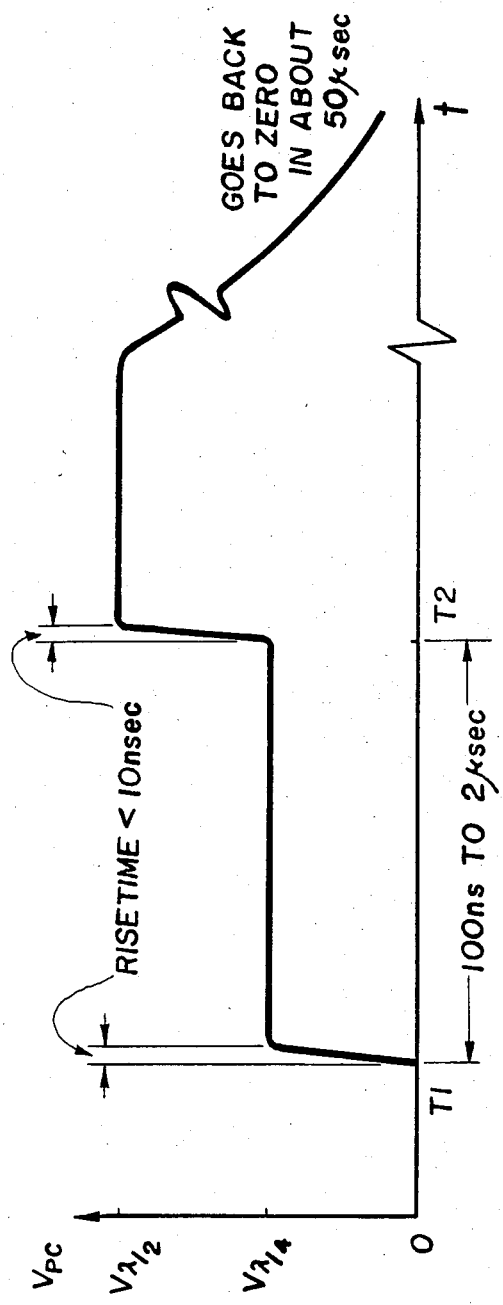

The foregoing and other objects, features and advantages of the invention will become more apparent from a reading of the following description in connection with the accompanying drawings in which:

FIG. 1 is a schematic diagram of a Pockels cell driver in accordance with the presently preferred embodiment of the invention; and FIG. 2 is a diagram indicating the variation in voltage across the Pockels cell with time which is obtainable with the circuit shown in FIG. 1 and which is desirable when the circuit is used to drive a Pockels cell located inside the cavity of a regenerative laser amplifier of the type described in the aforementioned U.S. patent application Ser. No. 618,274.

Referring to FIG. 1 there is shown a microwave triode vacuum tube 10 having an anode, grid and cathode. Filament current is supplied through filament transformer 20, one side of the secondary of which is grounded. A Pockels cell 12 is connected to a source of high voltage indicated as plus $V_{HV}$. The magnitude of this voltage depends upon the material used in the Pockels cell and may for example range from 7 to 15 KV. The Pockels cell material may for example be a conventional Pockels cell material such as KD*P or LiNbO$_3$ crystalline material. The Pockels cell is represented by its equivalent circuit of a capacitor shunted by a distributed resistance. The Pockels cell is connected to the high voltage source via a storage capacitor 14 and a current limiting resistor 16. The microwave triode is biased to cutoff by a source of negative potential indicated at $V_3$ through a resistor 18. So far described, the Pockels cell driver circuit is similar to the circuits described in the aforementioned U.S. patent applications and the articles by Sizer, et al. and Duling, et al.

A plurality of pulse amplifiers, in this embodiment two pulse amplifiers 22 and 24 which are identical in design, have inputs 26 and 28 and outputs 30 and 32. Trigger pulses T1 and T2 are applied to the inputs 26 and 28. These pulses are temporally separated, $T_2$ having a selected delay with respect to $T_1$. The delay may for example vary from 100 ns (nanoseconds) to 2 $\mu$s (microseconds) depending upon the time which a laser pulse injected into the cavity of the regenerative amplifier is to remain in that cavity before being emitted. For example, a pulse is rapidly amplified after it is trapped in the cavity and after about 500 ns, the pulse energy reaches saturation. Then the amplified pulse can be rejected or emitted from the cavity by the polarizer which rejects the pulse after it is suitably phase retarded by the Pockels cell acting as a half wave retarder.

As shown in the case of the pulse amplifier 22, each amplifier has two sections 34 and 36, the separation between which is defined by a pulse transformer 38, which may be a one-to-one transformer, which isolates an output FET stage 40 from a plurality of current amplifier stages. In the input section 34, these stages are an input FET stage 42, intermediate FET stages 44, 46 and 48 and a bipolar (NIN) transistor stage 50. All of the the stages are connected in tandem with each other between the input 26 and the output 30. The intermediate stages 42–50 are current amplifier stages which amplify the input trigger pulse and decrease the rise time thereof. The amplified pulses are coupled through the pulse transformer 38 which isolates the input stages against transients in the reverse direction (from the output to the input). Isolation and transient suppression is also enhanced by a diode 52 connected across the input winding of the transformer 38 and a capacitor 54 which is connected between one side of the input winding and ground. The last of the intermediate stages 48, which precedes the output stage 40, has its own separate power supply indicated as $+V_2$ which may for example be several times higher than the operating voltage indicated at $V_1$ for the stages 42 through 46 and 50 which precede the last intermediate stage 48 (e.g., 2 volts for $V_1$, and 100 volts for $V_2$) The capacitor 54 also acts as a storage capacitor to provide additional current when the stage 48 is rendered conductive which occurs upon occurrence of the input pulse T1.

The output stage 40 utilizes a power field effect transistor which obtains operating voltage from a source of voltage indicated at $-V_{r1}$. This is a variable voltage source. It will be noted that a separate variable voltage source $V_{r2}$ is used for the pulse amplifier 24 may share the voltage sources $+V_1$ and $+V_2$ with the amplifier 22. The voltage $V_{r1}$ may suitably be approximately $-400$ volts DC and adjustable downwardly from 400 volts. A filter capacitor 56 is connected across the variable voltage source supplying $V_{r1}$ so as to smooth any power supply transients. The source at $+V_2$ is also filtered by a large value capacitor 58. It will be appreciated that the power supplies which provide the operating voltage sources $V_1$, $V_2$ and $V_{r1}$ and $V_{r2}$ are returned to the same common return, reference potential point, indicated as ground.

The source and drain (S) and (D) are connected in series with the source $V_{r1}$ through a resistor 60. The drain is connected to the output 30 and the grid of the microwave tube 10 through a variable coupling capacitor 62. The magnitude of the voltage $V_{r1}$ and the capacitance of the coupling capacitor 62 control the output pulse duration and amplitude.

In the absence of the trigger pulse T1 (no pulse being applied across the input resistor 64) the FET of the first stage 42 is cut off. Since $+V_1$ is applied through a resistor 66 to the gate of the second stage FET 44, that FET is fully conductive. The voltage drop across a resistor 68 biases the transistor stage 50 to cut off. Since the gate of the next stage 46 is connected to ground through a resistor 70, the FET of the stage 46 is also cut off and no current flows through its source to ground resistor 72. The gate of the last stage 48 of the section 34 of the amplifier 22 is also connected to ground through the resistor 72 and another resistor 74. No current therefore flows through the pulse transformer 38. The current path through the primary of the transformer 38 is via a resistor 76, the primary of the transformer and the drain to source of the FET of the stage 48. The output stage is also biased to cut off by the voltage from the source $-V_{r1}$ which is applied through the drain resistor 60 to the gate of the stage 40 via the secondary of the pulse transformer, which is shunted by a resistor 78.

Upon occurrence of the trigger pulse, the input FET stage 42 becomes fully conductive. The second stage 44 is cut off. The transistor 50 is rapidly driven to full conduction which in turn drives the last two stages 46 and 48 to full conduction. During the transition from cutoff to full conduction in the FET of the last stage 48 of the amplifier section 34, a pulse is generated which is of high current amplitude since current is supplied from the separate voltage source $V_2$ and the capacitor 54. This large current pulse is coupled through the transformer 38 and applied to the gate of the output stage 40 FET. The output stage FET is rendered conductive very briefly for the duration of the driving pulse and generates a pulse which is transferred to the grid of the microwave tube 20 through coupling capacitor 62.

The voltage which is applied to the Pockels cell corresponds to the conduction time of the tube. This conduction time is directly related to the charge transferred from the output stage 40 to the grid of the tube 10. By controlling the amount of charge transferred to the grid, the Pockels cell voltage is controlled. The quantity of charge transferred is controlled by controlling the voltage of the $V_{r1}$ source and the capacitance of the capacitor 62 and is directly proportional to the voltage while being inversely proportional to the capacitance of the capacitor 62. Since there are separate coupling capacitors and variable voltage sources in each of the pulse amplifiers 22 and 24, the conduction time of the tube can be adjusted so as to obtain different voltage steps corresponding to quarter-wave and half-wave retardation.

FIG. 2 shows these voltage steps at $V_{\lambda/4}$ and $V_{\lambda/2}$. Inasmuch as the discharge through the Pockels cell internal resistance takes about 50 us the voltage is maintained for the selected delay (100 ns to 2 $\mu s$) between the trigger pulses T1 and T2.

By way of example and not by way of limitation the following component values and component types are given as being suitable for use in providing a Pockels cell driver circuit.

Tube 10—Varian Type Y—690
FET 42—VN10KM or 2N6661
FET 44—2N6661
FET 46—2N6661
FET 48—IRF510
FET 40—IRF440
Transistor 50—2N5109
Diode 52—AA404AA
Capacitor 54—820 pF
Capacitor 50—417 $\mu F$
Capacitor 56—2 nF
Capacitor 14—100 pF
Capacitor 62-50-200 pF,500 V
Capacitor 63—4.4 $\mu f$
Resistor 64—500 ohms
Resistor 66—4.7 K ohms
Resistor 68—130 ohms, 10 watts
Resistor 70—10K ohms
Resistor 72—72K ohms
Resistor 74—4.7 ohms
Resistor 76—1.2K ohms
Resistor 78—1.0K ohms
Resistor 60—2.7K ohms
Resistor 16—1.25M ohms From the foregoing description it will be apparent that there has been provided an improved Pockels cell driver circuit. Variations and modifications of the herein described circuit within the scope of the invention will undoubtedly suggest themselves to those skilled in the art. Accordingly, the foregoing description should be taken as illustrative and not in a limiting sense.

We claim:

1. In a Pockels cell driver circuit wherein a Pockels cell is charged via a vacuum tube having a grid to increase the voltage across the cell in a plurality of steps having a selected delay between each of said steps, the improvement comprising a plurality of pulse amplifiers, each of said amplifiers having an input for a separate one of a plurality of trigger pulses having said selected delay between of said trigger pulses, and each of said amplifiers having an output connected to the grid of said tube for applying amplified pulses corresponding to said trigger pulses which are applied to the input thereof to enable said cell to charge to each of said voltage steps.

2. The improvement according to claim 1 wherein each of said amplifiers has connected to said output thereof means for controlling the charge transferred to said grid during each of said pulses.

3. The improvement according to claim 2 wherein each of said amplifiers has an output circuit including a source of voltage for supplying said charge, and a coupling capacitor connected to said grid, at least one of the magnitude of said voltage from said source and the capacitance of said capacitor being variable.

4. The improvement according to claim 2 wherein said output circuit comprises a FET having gate, source and drain electrodes means for applying the pulse amplified and said amplified to said gate, said voltage source being connected in series with said source and drain electrodes and said coupling capacitor being connected between one of said source and drain and said grid.

5. The improvement according to claim 1 wherein each of said pulse amplifiers comprises a plurality of tandem connected FET current amplifier stages.

6. The improvement according to claim 5 wherein one of said stages is the output stage of said amplifier and includes an output FET having gate, source and drain electrodes, a pulse transformer coupling the one of said FET stages preceding said output stage to the gate of said output stage FET, a source of voltage, a resistor, said voltage source and said resistor being connected in series with said source and drain electrodes of said output FET, and a coupling capacitor connected between one of said source and drain electrodes of said output FET and said grid.

7. The improvements according to claim 6 wherein said pulse transformer has a primary winding and a secondary winding, said secondary winding being connected between said gate of said output FET and one of said source and drain thereof, said preceding FET also having gate source and drain electrodes, said primary being connected in series with a second source of voltage and said drain and source of said preceding FET, and a capacitor connected between one end of said primary winding and a point of reference potential for said second source of voltage.

8. The improvement according to claim 5 further comprising a bi-polar transistor current amplifier stage in tandem between two of said plurality of FET amplifier stages.

9. The improvement according to claim 8 wherein said by-polar transistor stage includes a transistor having a base and an emitter and a collector, one of said base and emitter being connected to the gate of the one of said FET stages intermediate to the stages thereof which are connected to said input and output of said amplifier, and said base being connected to one of the drain and source and of the FET stage immediately preceding said one intermediate FET stage.

10. The improvement according to claim 1 further comprising a further source of voltage connected to said grid and polarized to maintain said tube nonconductive in the absence of a pulse from the output of any of said plurality of amplifiers.

* * * * *